(12) United States Patent
Tang et al.

(10) Patent No.: US 6,855,645 B2
(45) Date of Patent: Feb. 15, 2005

(54) SILICON CARBIDE HAVING LOW DIELECTRIC CONSTANT

(75) Inventors: Xingyuan Tang, West Linn, OR (US); Haiying Fu, West Linn, OR (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 10/334,350

(22) Filed: Dec. 30, 2002

(65) Prior Publication Data
US 2004/0126929 A1 Jul. 1, 2004

(51) Int. Cl.$^7$ ............................................. H01L 21/31
(52) U.S. Cl. ...................................... 438/778; 438/783
(58) Field of Search ........................................ 438/778

(56) References Cited

U.S. PATENT DOCUMENTS

| | | | |
|---|---|---|---|
| 6,045,877 A | * | 4/2000 | Gleason et al. ............. 427/522 |
| 6,072,227 A | | 6/2000 | Yau et al. |
| 6,159,871 A | * | 12/2000 | Loboda et al. ............... 438/786 |
| 6,348,725 B2 | | 2/2002 | Cheung et al. |
| 6,372,304 B1 | | 4/2002 | Sano et al. |
| 6,395,649 B1 | | 5/2002 | Wu |
| 6,448,654 B1 | | 9/2002 | Gabriel et al. |
| 6,635,583 B2 | | 10/2003 | Bencher et al. |
| 2003/0176080 A1 | * | 9/2003 | Fu et al. ...................... 438/778 |

* cited by examiner

Primary Examiner—Douglas Wille
(74) Attorney, Agent, or Firm—Thomas Swenson

(57) ABSTRACT

A low-k precursor reactant compound containing silicon and carbon atoms is flowed into a CVD reaction chamber. High-frequency radio-frequency power is applied to form a plasma. Preferably, the reaction chamber is part of a dual-frequency PECVD apparatus, and low-frequency radio-frequency power is applied to the reaction chamber. Reactive components formed in the plasma react to form low-dielectric-constant silicon carbide (SiC) on a substrate surface. A low-k precursor is characterized by one of: a silicon atom and a carbon—carbon triple bond; a silicon atom and a carbon—carbon double bond; a silicon—silicon bond; or a silicon atom and a tertiary carbon group.

13 Claims, 6 Drawing Sheets

SILICON CARBIDE HAVING LOW DIELECTRIC CONSTANT

FIELD OF THE INVENTION

The invention is related to the field of barrier etch stop and insulator layers in integrated circuits, in particular, to silicon carbide layers having a low dielectric constant.

BACKGROUND OF THE INVENTION

Statement of the Problem

Conventional semiconductor devices typically comprise a semiconductor substrate, usually of doped monocrystalline silicon, and a plurality of sequentially formed intermetal dielectric layers and electrically conductive patterns. An integrated circuit contains a plurality of patterns of conductive lines separated by interwiring spacings, and a plurality of interconnect lines, such as bus lines, bit lines, word lines, and logic interconnect lines. Typically, the conductive patterns of vertically spaced metallization levels are electrically interconnected by vertically oriented conductive plugs filling via holes formed in the intermetal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

As the density of integrated circuits increases and feature sizes become smaller, resistance-capacitance (RC) coupling and resulting RC delays become more of a problem. Since capacitance is directly proportional to the dielectric constant ("k"), RC problems can be reduced if a low-dielectric-constant material is used as insulating material.

Formation of integrated circuit elements, for example, memory cells, electrically-conductive interconnects, and wiring layers, typically includes patterning and etching of an integrated circuit substrate. These processes typically include deposition of an etch stop layer, patterning of the etch stop layer, then removal of portions of the etch stop layer, and subsequent etching of the substrate around the remaining portions of the etch stop layer. In a copper damascene process scheme, the remaining portions of an etch stop layer are not removed after etching. Instead, the remaining portions of the etch stop layer are included in the finished integrated circuit. If portions of an etch stop layer are included in a finished integrated circuit, it is important that the etch stop layer have a dielectric constant comparable to the low dielectric constant of insulators used in the integrated circuit. An etch stop layer having a dielectric constant higher than the insulating material proximate to it increases the overall dielectric constant. It is also important that an etch stop layer allow high selectivity during the etching process so that the layer above the etch stop layer that needs to be etched can be selectively etched.

Etch stop layers comprising silicon nitride ("SiN") or silicon carbide ("SiC") are being used in copper ("Cu") damascene techniques. SiN and SiC layers possess good electrical properties and are good Cu-diffusion barriers and etch stop layers. Nevertheless, existing etch stop/barrier layers have a relatively high dielectric constant, k. For example, SiN has a dielectric constant of about 7, and SiC formed using tetramethylsilane ("4MS") typically has a k-value in the range of about 4.3 to 5.5. Used as etch stop layers, materials having relatively high k-values inhibit desired reduction of the effective k of the overall damascene structure.

SUMMARY OF THE INVENTION

The invention helps to solve some of the problems mentioned above by providing a silicon carbide ("SiC") thin-film layer having a low dielectric constant ("low k") and a method and a precursor for producing it. Low-dielectric-constant ("low-k") SiC layers in accordance with the invention are useful as barrier etch stop layers in a wide variety of applications, in particular, in the formation of integrated circuit structures using copper damascene techniques to make metallized interconnect and wiring layers in vias and trenches. In addition, a low-k SiC layer in accordance with the invention is generally useful as a low-k insulator in an integrated circuit; for example, as an intermetal dielectric layer, an interlayer dielectric layer, a capping layer, and a barrier layer.

In one aspect, a method of forming silicon carbide in accordance with the invention comprises flowing a precursor selected for formation of low-k SiC ("low-k precursor") containing silicon and carbon atoms into a reaction chamber, and forming a plasma containing silicon atoms and carbon atoms in the reaction chamber. Exemplary low-k precursors include: Ethynyltrimethylsilane ("ETMS"), Vinyltrimethylsilane ("VTMS"), Hexamethyldisilane ("HMDS"), Bis(dimethylamino) dimethylsilane ("BDMADMS"), t-Butoxytrimethylsilane ("tBOTMS"), Bis(trimethylsilyl) acetylene ("BTMSA"), 1-Trimethylsilylpropyne ("1-TMSP"), 2-Propenyltrimethylsilane ("2-PTMS"), Divinyldimethylsilane ("DVDMS"), 1,3-Diethynyltetramethyldisiloxane ("1,3-DETMDS"), Vinyldimethylsilane ("VDMS"), Vinyl-t-butyidimethylsilane ("VBDMS"), and Vinylethynyidimethylsilane ("VEDMS").

In another aspect, a method in accordance with the invention further comprises flowing a doping gas into the reaction chamber. In still another aspect, the doping gas comprises a gas selected from the group consisting of $CO_2$, CO, $H_2O$, methanol, $CH_4$, $C_2H_6$, $C_2H_2$, and $C_2H_4$. In another aspect, the doping gas comprises a gas selected from the group consisting of $O_2$, $O_3$, $N_2$, and $NH_3$. In still another aspect, a method in accordance with the invention further comprises flowing an inert gas into the reaction chamber. In another aspect, the inert gas comprises a gas selected from the group consisting of neon, helium, and argon.

In another aspect, flowing a low-k precursor comprises flowing ETMS gas and an inert gas into the reaction chamber. In another aspect, the ETMS/inert flow rate ratio is in a range of about from 2/1 to 1/10. In still another aspect, flowing a low-k precursor comprises flowing ETMS gas and a doping gas into the reaction chamber. In another aspect, the ETMS/doping flow rate ratio is in a range of about from 2/1 to 1/20. In still another aspect, flowing ETMS gas and a doping gas into the reaction chamber comprises flowing ETMS gas and $CO_2$ gas at a ETMS/$CO_2$ flow rate ratio in a range of about from 1/2 to 1/20, preferably at a ETMS/$CO_2$ flow rate ratio in a range of about from 1/4 to 1/10.

In another aspect, forming a plasma comprises maintaining a pressure in the reaction chamber in a range of about from 1 Torr to 9 Torr, and applying HF RF power to the reaction chamber at a frequency in a range of about from 1 MHz to 100 MHz and at a power level in a range of about from 0.1 $W/cm^2$ to 5 $W/cm^2$. In another aspect, forming a plasma further comprises applying LF RF power to the reaction chamber at a frequency in a range of about from 100 kHz to 1 MHz and at a power level in a range of about from 0.1 W/cm$^2$ to 5 W/cm$^2$.

In another aspect, flowing a low-k precursor comprises flowing HMDS into the reaction chamber. In another aspect, in addition to flowing HMDS, a method in accordance with the invention further comprises flowing $CO_2$ into the reaction chamber.

In another aspect, flowing, a low-k precursor containing silicon and carbon atoms into a reaction chamber comprises flowing a compound selected from a group consisting of a compound comprising a silicon atom and a carbon—carbon triple bond, a compound comprising a silicon atom and a carbon—carbon double bond, a compound comprising a silicon—silicon bond, and a compound comprising a silicon atom and a tertiary carbon group.

BRIEF DESCRIPTION OF THE DRAWINGS

A more complete understanding of the invention may be obtained by reference to the drawings, in which.

DESCRIPTION OF THE INVENTION

Figure 1:
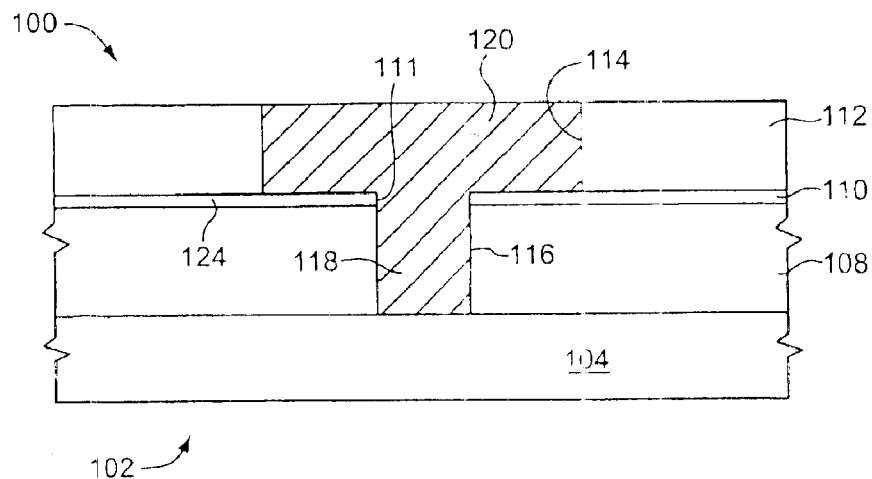
FIG. 1 depicts in schematic form a section of an integrated circuit wafer containing a low-k SiC layer in accordance with the invention used as an etch stop and barrier layer.

The invention is described herein with reference to exemplary un-doped and doped silicon carbide films. Representative uses, fabrication equipment, process operating conditions and electronic characteristics of low-k SiC in accordance with the invention are described with reference to FIGS. 1–8. It should be understood that the particular embodiments serve explanatory purposes and are not limiting descriptions of structures and methods in accordance with the invention. Furthermore, exemplary silicon carbide films discussed herein below were fabricated in accordance with the invention in a Novellus "Sequel" PECVD module, which accommodates six 200 mm wafers. The flow rates of gaseous and liquid streams presented and discussed in the application are total flow rates into a Novellus "Sequel" reactor apparatus. It is understood that silicon carbide deposition may also be conducted using an apparatus having a volume and wafer-capacity different from the module used in the examples without departing from the scope of the invention. The structures and systems depicted in schematic form in FIGS. 1–4 serve explanatory purposes and are not precise depictions of actual structures and systems in accordance with the invention. Thus, the embodiments described herein are exemplary and are not intended to limit the scope of the invention, which is defined in the claims below.

An object of a method in accordance with the invention is fabrication of a silicon carbide layer having a low dielectric constant. A low-k silicon carbide film in accordance with the invention is particularly useful as an etch stop and barrier layer in an integrated circuit. It is also useful as an intermetal dielectric layer or other dielectric insulator.

An important aspect of embodiments in accordance with the invention is the plasma-enhanced reaction of one or more reactant precursors from a group of selected organosilicon reactant precursors ("low-k precursors") to form low-k silicon carbide. Preferred "low-k precursors" include, but are not limited to:

Ethynyltrimethylsilane ("ETMS"), represented by the formula $SiC_5H_{10}$;
Vinyltrimethylsilane ("VTMS"), $SiC_5H_{12}$;
Hexamethyldisilane ("HMDS"), $Si_2C_6H_{18}$;
Bis(dimethylamino)dimethylsilane ("BDMADMS"), $SiC_6N_2H_{18}$;
t-butoxytrimethylsilane ("tBOTMS"), $SiC_7OH_{18}$;
Bis(trimethylsilyl)acetylene ("BTMSA"), $Si_2C_8H_{18}$;
1-Trimethylsilylpropyne ("1-TMSP"), $SiC_6H_{12}$;
2-Propenyltrimethylsilane ("2-PTMS"), $SiC_6H_{14}$;
Divinyldimethylsilane ("DVDMS"), $SiC_6H_{12}$;
1,3-Diethynyltetramethyldisiloxane ("1,3-DETMDS"), $Si_2C_8H_{14}O$;
Vinyldimethylsilane ("VDMS"), $SiC4H_{10}$;
Vinyl-t-butyldimethylsilane ("VBDMS"), $SiC_8H_{18}$; and
Vinylethynyldimethylsilane ("VEDMS"), $SiC_6H_{14}$.

Reaction of a low-k precursor using a process chemistry in accordance with the invention promotes large free volume and open structures in the deposited SiC film, thereby lowering the dielectric constant of the film while maintaining the film's qualities as a good etch stop and barrier material. A low-k SiC film in accordance with the invention remains stable during fabrication and during service.

A common feature of low-k precursors in accordance with the invention is the presence of a carbon-rich, bulky, or reactive functional group. Exemplary functional groups include: an ethynyl group, which has a triple bond; a vinyl group, which has a double bond; a silicon—silicon bond; and a t-butyl group, which is especially bulky. Incorporation of such a functional group into a SiC film in accordance with the invention results in a larger free volume and corresponding lower k-value than in SiC films currently being used. Incorporation of a functional group of a low-k precursor typically enhances etch selectivity compared to conventional SiC material.

An etch process basically involves two concurrent phenomena, namely cross-linking and etching. Cross-linking of an etch stop layer with incoming etch gas increases etch selectivity. In contrast, etching reduces selectivity. In a low-k SiC film fabricated in accordance with the invention using low-k precursor ETMS comprising a carbon—carbon triple bond, rigid triple bonds incorporated into the film structure not only increase the free volume significantly, but also promote higher etch selectivity because of the relatively high in-film carbon content and because the triple bonds are relatively highly prone to cross-linking.

In a low-k SiC film fabricated using low-k precursor HDMS, Si—Si bonds are incorporated into the SiC film. The resulting relatively high intrinsic silicon content provides greater etch selectivity than in conventional SiC layers. Also, the Si—Si bonds possess lower dissociation energy and are, therefore; more reactive than Si—C bonds. The higher reactivity of the Si—Si bonds enables enhanced incorporation of carbon; oxygen, and nitrogen in corresponding doping environments. Generally, increasing the carbon and silicon content of a SiC layer enhances etch selectivity.

The selective incorporation of dopants in accordance with the invention into a low-k SiC film allows tuning of the dielectric constant, k, and other properties to a desired level.

The incorporation of nitrogen atoms into a SiC layer in accordance with the invention generally increases etch selectivity of the SiC layer because of the structural differences between the N-containing SiC and the target layer being selectively etched. For example, target layers being etched in an integrated circuit fabrication sequence are often carbon-doped oxides having a low-dielectric constant. Conventional ILDs typically comprise carbon-doped oxide containing a higher oxygen content than an etch stop layer. The higher oxygen content of an ILD generally results in a lower dielectric constant, k, than in an etch stop layer. The structural difference between a barrier etch stop layer comprising N-doped low-k SiC in accordance with the invention and an ILD containing carbon-doped oxide results in greater etch-selectivity between the two layers. On the other hand, the presence of nitrogen atoms in a SiC barrier etch stop layer sometimes interferes with resist layers used in patterning techniques.

Dopants are incorporated in accordance with the invention into a low-k SiC film by flowing one or more chemical doping agents into the reaction chamber along with a low-k precursor, in which a plasma is formed by applying energy to the resulting reaction mixture. Alternatively to a doping agent, or in addition, a dopant is incorporated into a low-k SiC film by including doping atoms in a low-k precursor compound. Doping agents include, but are not limited to: $CO_2$, CO, $H_2O$, methanol, $O_2$, $O_3$, $N_2$, $NH_3$, $CH_4$, $C_2H_6$, $C_2H_2$, and $C_2H_4$. Nitrogen-containing doping agents typically comprise nitrogen gas, $N_2$, or ammonia gas, $NH_3$, or both. Oxygen-containing doping molecules typically comprise weakly-oxidizing oxygen-containing molecules, such as $CO_2$. In another embodiment in accordance with the invention, strongly-oxidizing molecules, such as gaseous oxygen ($O_2$), nitrous oxide ($N_2O$), and ozone ($O_3$), are flowed into the reactor as doping agents. Because, the strongly-oxidizing oxygen atoms present in the plasma are so reactive, it is necessary to limit the amount of strongly-oxidizing molecules flowing into the reaction chamber to a relatively small amount, for example, about the same or less than the number of organosilicon low-k precursor molecules. Otherwise, the number of oxygen atoms incorporated into the deposited layer would exceed dopant levels and adversely affect the etch selectivity of the silicon carbide. To maximize etch selectivity, a PECVD process in accordance with the invention is typically conducted oxidizer-free and oxygen-free, except for oxygen atoms that are included in a low-k reactant precursor molecule. In some embodiments in accordance with the invention, dopant atoms are present in the low-k precursor. For example, nitrogen is present in low-k precursor BDMADMS, and oxygen is present in low-k precursor tBOTMS. When a dopant atom is present in a low-k precursor, it is typically incorporated into the low-k SiC material, resulting in a doped low-k SiC film without use of a separate doping gas.

FIG. 1 depicts in schematic form a section 100 of a metal interconnect structure on an integrated circuit wafer 102 containing low-k SiC fabricated in accordance with the invention. A generalized metal interconnect structure as shown in FIG. 1 is typically fabricated using a dual damascene process, as known in the art. Substrate 104 is typically a semiconductor substrate of an active device, such as a transistor, or substrate 104 is an electrically conductive element of an integrated circuit, such as a memory capacitor or a metallization layer. A first interlayer dielectric ("ILD") layer 108 is deposited on substrate 104, using a conventional deposition technique. ILD layer 108 typically comprises a silicon-oxide-based dielectric material having a low dielectric constant, as known in the art. A barrier etch stop layer 110 fabricated in accordance with the invention then is deposited on ILD 108. Etch stop layer 110 typically has a thickness in a range of about from 5 nm to 500 nm, preferably in a range of about from 20 nm to 100 nm. A second ILD 112 then is formed on upper etch stop layer 110. Using patterning and etching techniques known in the art, an opening 114, typically in the form of a trench, is etched down through ILD 112 and stops at barrier etch stop layer 110. An opening 111 in etch stop layer 110 then is made using conventional photolithographic and etching techniques; and etching is continued at opening 111 through ILD 108 down to substrate 104 to make opening 116. Typically, opening 116 through ILD 108 has a shape of a via. Conductive material, preferably comprising copper, then is deposited using a process known in the art to fill openings 116, 111, and 114, thereby forming conductive via 118 and conductive line 120. The remaining portion 124 of barrier etch stop layer 110 serves as a barrier between conductive line 120 and circuit elements below barrier etch stop layer 110.

Alternatively, a metal interconnect structure as shown in FIG. 1 is fabricated using a single damascene process, as: known in the art. In a single damascene process scheme, a first interlayer dielectric ("ILD") layer 108 is deposited on substrate 104, using a conventional deposition technique. An opening 116 (via) then is made using conventional photo-lithographic and etching techniques. A metal plug 118 is formed in opening 116, typically by blanket deposition of the metal, followed by CMP. Barrier etch stop layer 110, fabricated in accordance with the invention, is deposited over the planarized surface. A second ILD 112 then is formed on etch stop layer 110. Using patterning and etching techniques known in the art, a trench opening 114 is etched down through ILD 112 and stops at barrier etch stop layer 110. An opening 111 in etch stop layer 110 then is made using conventional photolithographic and etching techniques, and etching is continued at opening 111 through ILD 108, stopping at the top surface of metal plug 118. Thereafter, copper-containing metallization is deposited on the substrate to fill opening 111 and trench 114, thereby forming conductive interconnect line 120. It is understood that low-k SiC in accordance with the invention is useful in a wide variety of structures and applications of the integrated circuit art.

Figure 2:
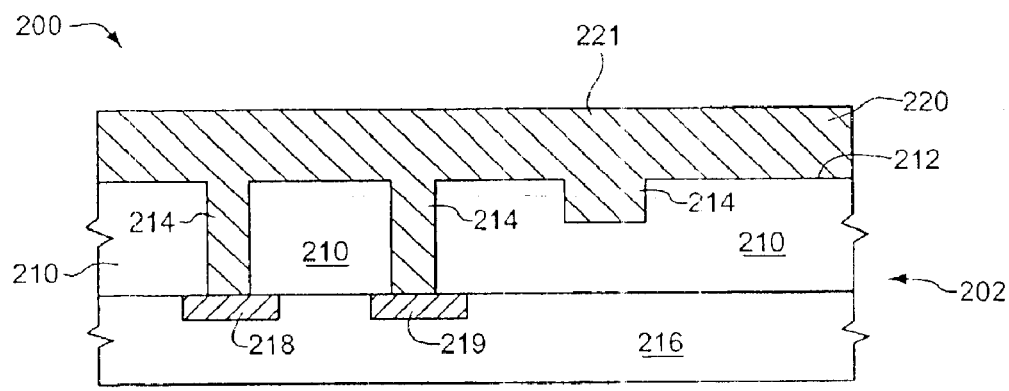
FIG. 2 depicts in schematic form a section of an integrated circuit wafer containing a low-k SiC layer in accordance with the invention used as a dielectric insulator.
Figure 3:
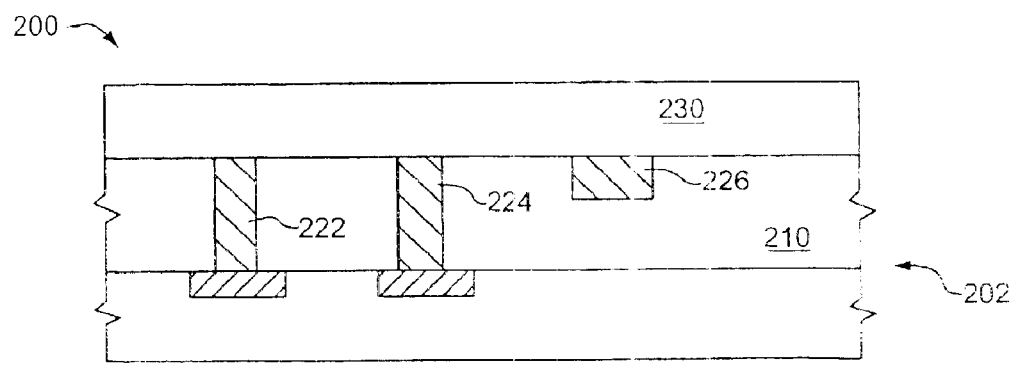
FIG. 3 depicts the section of FIG. 2 in a later phase of fabrication in which the SiC layer has been removed and a second low-k SiC layer covers the surface.

FIG. 2 depicts in schematic form a section 200 of an integrated circuit wafer 202 containing a low-k SiC layer 210 in accordance with the invention. Low-k SiC insulator layer 210 contains unetched surface portion 212 and etched portions 214. Section 200 includes a device layer 216, typically containing dielectric or semiconductor material. Active components 218, 219 represent active devices or electrical connectors. Metal layer 220 has been formed on SiC layer 210, upper metal layer 221 covering surface portion 212, and lower parts of metal layer 220 filling etched portions 214. FIG. 3 depicts section 200 in a later phase of fabrication. Metal layer 220 has been removed from surface 212, thereby forming metal lines 222, 224, 226. Thus, SiC 210 serves as an intermetal dielectric layer between metal lines 222 and 224. A low-k SiC layer 230 has been deposited in accordance with the invention over SiC insulator layer 210 and metal lines 222, 224, 226. Thus, SiC layer 230 serves as a capping layer, or alternatively, it may be etched or otherwise processed for additional features and serve as another intermediate insulating layer. Generally, a barrier layer (not shown) is formed between a metal layer and a dielectric layer in accordance with the invention.

Figure 4:
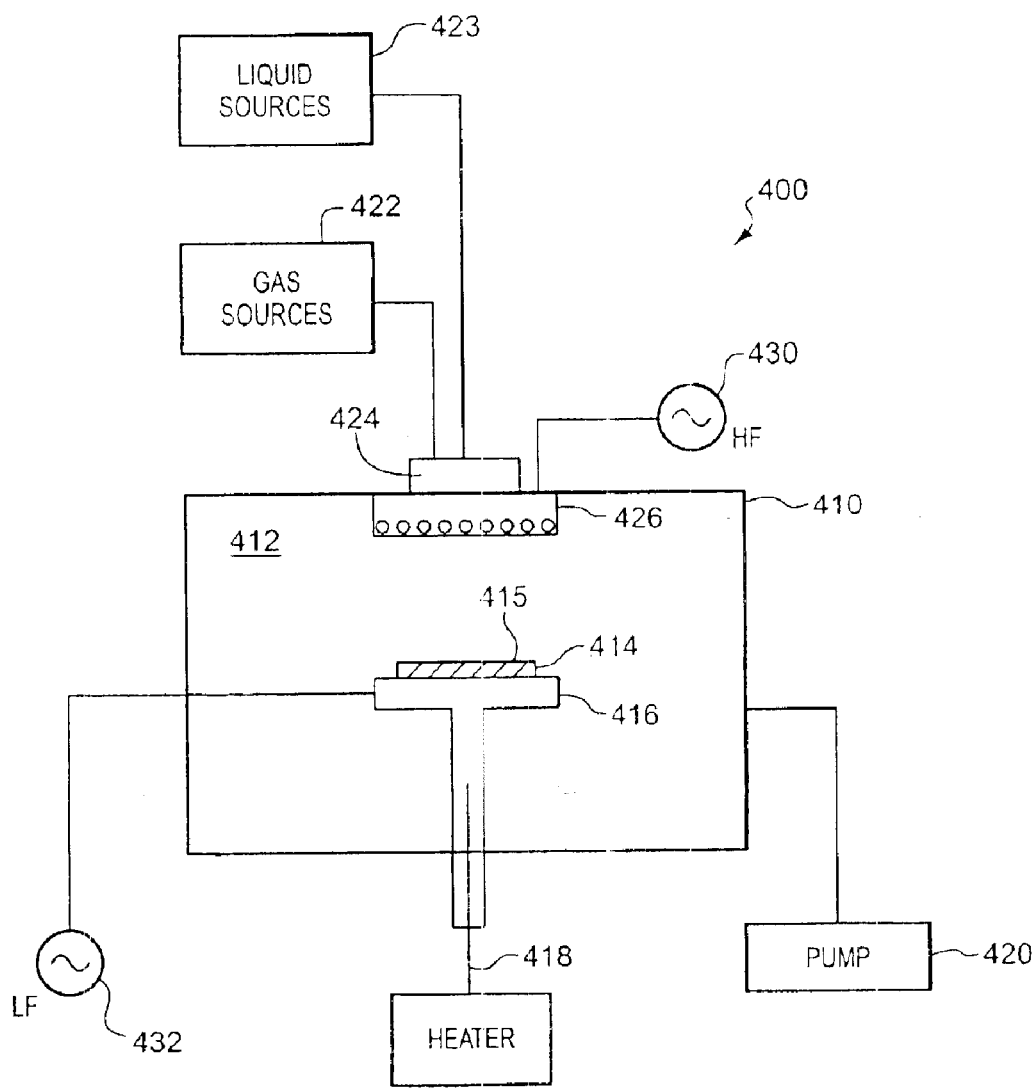
FIG. 4 depicts in schematic form a CVD apparatus suitable for depositing a low-dielectric-constant SiC layer by a PECVD method in accordance with the invention.

FIG. 4 depicts in schematic form a CVD apparatus 400 suitable for depositing a low-dielectric-constant SiC layer by a plasma-enhanced CVD ("PECVD") method in accordance with the invention. Apparatus 400 includes a reaction chamber 410 having a chamber interior 412 capable of holding one or more substrates 414 having an upper surface 415 on which a layer of low-k SiC is to be deposited. Substrate 414 is supported in chamber 410 on substrate holder 416. Substrate holder 416 is functionally coupled with a heating unit 418 for heating substrate 414 to a desired temperature. Generally, substrate 414 is maintained at a temperature in a range of about from 25° C. to 600° C., preferably in a range of about 300° C. to 425° C. As is typical in such chambers, the reactor chamber interior 412 is evacuated or pressurized as desired by a suitable pump apparatus schematically represented in FIG. 4 as pump 420. In a method in accordance with the invention, pressures in the reaction chamber generally are maintained in a range of about from 0.1 Torr to 30 Torr, preferably at about 1 Torr to 9 Torr.

One or more low-k precursor reactants used in a method in accordance with the invention are supplied to reaction chamber 410 from gas sources 422 and liquid sources 423, as appropriate. Inert diluent gases and doping agents, if used, are also supplied from gas sources 422 and liquid sources 423, as appropriate. Gases and liquids from gas sources 422 and liquid sources 423, respectively, are introduced into mixing bowl 424. The interior of mixing bowl 424 is connected to interior 412 of reaction chamber 410 through showerhead 426. Liquids are injected as a fine mist by techniques known in the art into mixing bowl 424. The interior of mixing bowl 424 is maintained at a temperature typically in a range of about from room temperature to 200° C. Fine liquid mist particles evaporate quickly in mixing bowl 424. The gas resulting from gasification of liquid mixes with the other gases in mixing bowl 424. The resulting gaseous mixture containing gaseous precursor reactants flows from mixing bowl 424 through showerhead 426 into the interior 412 of reaction chamber 410. The flow rates of gases and liquids from sources 422, 423 are typically controlled by volumetric flow rate controllers using techniques known in the art. Generally, the gaseous mixture flowing into reaction chamber 410 contains inert diluent gas that functions in maintaining desired pressure in reaction chamber 410 and in maintaining relatively dilute concentrations of reactant precursor in the gaseous mixture, and/or dopant gases that provide dopant atoms as well as diluting and pressurizing functions.

In one basic embodiment in accordance with the invention, low-k SiC is produced by flowing a gaseous stream containing one or more organosilicon low-k precursors into the reaction chamber, and forming a plasma from a reactant gas mixture: In certain embodiments, the gaseous stream includes an inert diluent gas. In certain embodiments, the gas mixture introduced into the reaction chamber includes one or more dopant gases containing dopant atoms, such as carbon atoms, oxygen atoms, nitrogen atoms, hydrogen atoms.

Plasma discharge is sustained by energy applied to reaction chamber 410 through a high-frequency ("HF") generator 430, which supplies HF radio-frequency ("RF") power. Usually, HF RF power is applied to reaction chamber 410 at showerhead 426. Typically, the HF RF plasma energy used is 13.56 MHz, although the invention is not limited to any exact frequency value. Generally, the HF RF has a frequency in a range of about from 1 MHz to 100 MHz, preferably 2 MHz to 30 MHz. HF RF power is generally applied at showerhead 426 at a level of about 0.1 Watts per $cm^2$ to 5 Watts per $cm^2$ of substrate surface. The reactive species present in the plasma react to form low-k SiC on the substrate surface. In a preferred embodiment of a method in accordance with the invention, a dual-frequency chamber also provides low-frequency radio-frequency ("LF RF") power to the plasma. As depicted in FIG. 4, CVD apparatus 400 includes LF generator 432 for supplying low-frequency power to plasma between showerhead 426 and substrate 414. The low-frequency RF power is generally applied at substrate holder 416. Generally, the LF RF has a frequency in a range of about from 100 kHz to 1 MHz, preferably about 250 kHz. LF RF power is generally applied at a level of about 0.1 Watts per $cm^2$ to 5 Watts per $cm^2$ of substrate surface. With respect to applying HF and LF power, the term "to the reaction chamber" is used herein a broad sense. For example, HF power generator supplies power to the reactant gas mixture flowing from mixing bowl 424 through showerhead 426 into reaction chamber interior 412, as depicted in FIG. 4, or alternatively it supplies power in reaction chamber interior 412. Similarly, LF RF generator 432 applies power to the reaction chamber at an appropriate location, for example, to a substrate holder.

With respect to introducing or flowing gases and gaseous molecules "to the reaction chamber", the term "to the reaction chamber" and related terms are used broadly to mean towards and up to the reaction chamber or into the reaction chamber depending on where plasma-forming power is applied in a particular CVD apparatus used in accordance with the invention. For example, in certain embodiments in accordance with the invention, plasma-initiating power is applied to a gaseous stream prior to its entry into the reaction chamber, so that molecules originally present in the gaseous stream are already broken up into reactive species upon actual entry into the reaction chamber.

In some embodiments in accordance with the invention, a low-k precursor is provided from a liquid source, and a controlled flow of the liquid precursor is vaporized, for example, by being injected as a mist into a mixing bowl. The gasified precursor is then introduced into the reaction chamber. In this specification including the claims, terms referring to a low-k precursor gas also include precursor gas that was formed by gasifying a liquid precursor.

In certain embodiments in accordance with the invention, nonreactive diluent gas is used to dilute low-k precursor reactant and to pressurize the reaction chamber. Suitable nonreactive or inert gases include noble gases, such as neon, helium, and argon. In certain embodiments, introduction of inert gases into the reaction chamber serves to adjust SiC-film uniformity, to stabilize the plasma, to improve film stability, to adjust film stress, and to adjust the dielectric constant. For example, a 50% increase in inert-gas flow rate accompanying ETMS into a PECVD reaction chamber caused about a 75% decrease in nonuniformity percentage, and about a 40% increase in film stress.

Through selection of operating variables such as composition and flow rates of reactant precursor, inert gas and doping gases, power level, deposition pressure, and temperature, the composition and properties of a low-k SiC film can be controlled. Dynamically varying one or more variables during the course of forming a low-k SiC film provides further control of the composition and properties of the deposited low-k SiC material. Atomic concentrations of a low-k SiC layer in accordance with the invention are typically in the following approximate ranges: 1% to 10% hydrogen; 20% to 35% silicon; and 40% to 70% carbon. Good-quality low-k SiC layers having a dielectric constant in a range of about from 2.7 to 4.5 are deposited at a rate in a range of about 15 nm/min to more than 800 nm/min. Low-k SiC layers in accordance with the invention are thermally stable in process conditions typically used in semiconductor manufacturing. Therefore, thin-film properties, such as dielectric constant, k, and film stress do not vary significantly during and after subsequent semiconductor manufacturing operations.

A set of representative ranges of operating; variables and conditions for depositing low-k SiC in accordance with the invention is presented here. The flow rates and operating parameters listed are valid for a Novellus "Sequel" PECVD module having six RF stations to deposit low-k SiC on 200 mm integrated circuit wafers. It is understood that the flow rates listed here would require modification for a different-sized reaction chamber.

| Gaseous low-k precursor flow: | 100 sccm–2000 sccm |
|---|---|
| Liquid low-k precursor flow: | 0.2 ccm–20 ccm |
| $CO_2$ flow: | 0 sccm–8000 sccm |
| $N_2$ flow: | 0 sccm–5000 sccm |
| $NH_3$ flow: | 0 sccm–5000 sccm |
| $O_2$ flow: | 0 sccm–400 sccm |
| inert gas flow: | 0 sccm–3000 sccm (e.g., He) |
| HF-RF: | 200 W–4000 W |
| LF RF: | 0 W–2000 W |
| Pressure: | 1 Torr–9 Torr |
| Temperature: | 25° C.–425° C. |

Figure 5:
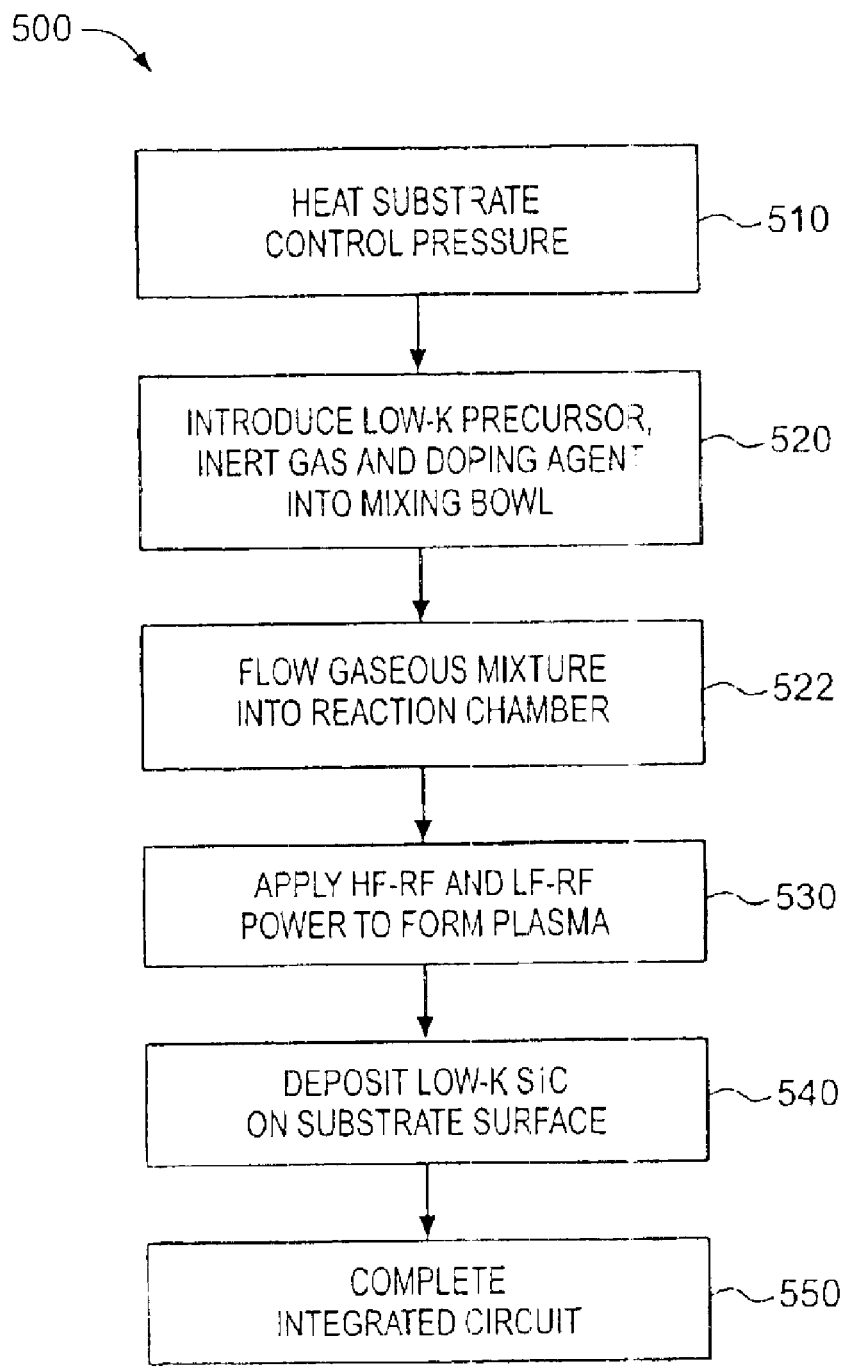
FIG. 5 contains a flowchart of a preferred method in accordance with the invention.

FIG. 5 contains a generalized flow chart 500 of a preferred method in accordance with the invention. It is understood that a method in accordance with the invention is a continuous process, and that processes 510 through 540 of FIG. 5 are conducted simultaneously. In processes 510, a substrate is heated to a temperature in a range from about 350° C. to 425° C. Preferably, a heater in the substrate holder heats the wafer and maintains its temperature. The substrate surface comprises base silicon or one or more other integrated circuit layers. In processes 520, gaseous or liquid low-k precursor reactant, preferably ETMS, is flowed into a mixing bowl, as described above. Liquid precursor is injected through a liquid injector so that small droplets evaporate immediately at the elevated temperature and reduced pressure in the mixing bowl. Optionally, helium gas or another inert gas is also flowed into the mixing bowl at a precursor/inert flow rate ratio in a range of about 1/10 to 1/2. Optionally, in processes 520, doping gas is introduced into the reaction chamber. In steps 522, the resulting reaction-gas mixture in the mixing bowl is fed into the reaction chamber through a showerhead. Typically, to maximize etch selectivity, no oxidizer gas is present in or introduced into the reaction chamber. In certain embodiments, a weak oxidizing gas or other oxygen-containing doping gas is introduced into the reaction chamber to lower the dielectric constant of the deposited SiC material. In processes 530, HF—RF power (e.g., 13.56 MHz, 0.3 W/cm$^2$) and LF-RF power (e.g., 250 kHz, 0.1 W/cm$^2$) are applied to ignite and sustain the plasma discharges. As a result, in processes 540, low-k SiC deposits on the substrate surface. Preferably, a low-k SiC film in accordance with the invention is deposited as a series of low-k SiC sublayers, each of which is formed at one of a sequence of processing stations in a multi-station PECVD apparatus. For example, a method in accordance with the invention is practiced in commercially available multiple-station CVD units, such as the Concept One, Concept One MAXUS™, Concept Two SEQUEL Express™, Concept Two Dual SEQUEL ExpreSS™, Concept Three SEQUEL™, and VECTOR™ System plasma-enhanced chemical vapor deposition (PECVD) units, which are manufactured by Novellus Systems, Inc., of San Jose, Calif. Nevertheless, methods of making low-k SiC films in accordance with the invention are not limited to multiple-station CVD systems, such as described above. Low-k SiC in accordance with the invention is fabricated also using single-station units known in the art. After deposition of the SiC layer is completed in processes 540, further processing of an integrated circuit wafer is continued in steps 550.

A feature of embodiments in accordance with the invention is that the dielectric constant, k, and the etch selectivity of a SiC film are influenced by, among other factors, selection of the composition and flow rates of a low-k precursor, an inert diluent gas, and a doping agent. A low-k silicon carbide film fabricated in accordance with the present invention typically has a dielectric constant, k, in a range of about 2.6 to 3.5. Embodiments in accordance with the invention are also useful for making SiC material having dielectric constants higher than 3.5. For example, SiC films having a dielectric constant greater than 3.5 are fabricated by reacting a low-k precursor reactant in a PECVD reaction chamber and providing LF RF power at a relatively high-level, for example, up to 0.8 W/cm$^2$. Useful thicknesses of silicon carbide coatings fabricated in accordance with the invention are in a range of about from 5 nm to 2 $\mu$m. Silicon carbide coatings used as etch stop and barrier layers in integrated circuits typically have a thickness in a range of about from 15 nm to 80 nm. The deposition rate of silicon carbide in a method in accordance with the invention is typically in a range of about from 10 nm/min. to 800 nm/min., and preferably in a range of about from 30 nm/min. to 150 nm/min. The deposition rate is controlled principally by varying the pressure and temperature of the reaction chamber and the power of the low-frequency radio-frequency bias applied to the substrate.

EXAMPLE 1

A series of exemplary low-k SiC films was fabricated using a PECVD method in accordance with the invention using the low-k precursor reactant ETMS. Each low-k SiC film was deposited on a 200 mm silicon semiconductor wafer substrate in a Novellus "Sequel" model, 6-station dual-frequency PECVD apparatus. The substrate surface before processing comprised monocrystalline silicon. The low-k SiC was deposited at a wafer temperature of about 400° C. Pure low-k precursor ETMS reactant gas was flowed into the process reaction chamber at a flow rate of 500 sccm. Process conditions between example wafers were varied to determine the effect of various operating parameters on film characteristics.

Inert helium gas was mixed with the ETMS precursor gas in a gas mixer and the gaseous reactant mixture was introduced into the reaction chamber at a constant flow rate. The flow rate of helium gas varied in a range of about from 1000 sccm to 3000 sccm. HF RF power was applied to the showerhead at a frequency of 13.56 MHz, and the HF power was varied in a range of about from 200 Watts to 1000 Watts.

LF RF power was applied to the substrate holder at a frequency of 250 kHz, and was varied in a range of about from 0 Watts to 400 Watts. Pressure in the reaction chamber was varied in a range of about from 2.5 Torr to 5 Torr.

Table 1 below includes operating conditions used in fabricating exemplary undoped low-k silicon carbide films in accordance with the invention. It should be understood that Table 1 does not include all process combinations tested. It should be likewise understood that many different combinations of process operating conditions not shown in Table 1 may be utilized in accordance with the invention. Table 1 also includes measured values of physical and electronic characteristics of the low-k SiC films listed. The refractive indices and k-values of the SiC films were measured at roughly the same time, within one hour of each other. The dielectric constant, k, was measured using a Hg-probe at 1 MHz. Film stress was tested in a FSM stress tool. From these measurements, compressive stress and tensile stress in the SiC films were obtained. Blanket etch selectivity ("E/S") of selected SiC films was measured against a PORA film. SiC films having a thickness of 300 nm and PORA films having a thickness of 1 $\mu$m were etched in the same batch of a LAM etching tool, using a conventional etch recipe including $C_4F_8$, argon, and $N_2$ at 80 mTorr using HF and LF power. The reductions in film thickness of both films were compared and the etch selectivity of the SiC films was calculated.

TABLE 1

| Recipe No. | ETMS (Sccm) | He (Sccm) | Pres (Torr) | HFRF (W) | LFRF (W) | RI | k |
|---|---|---|---|---|---|---|---|
| 1 | 500 | 1500 | 2.5 | 600 | 400 | 1.737 | 3.41 |
| 2 | 500 | 3000 | 3 | 600 | 400 | 1.7562 | 3.67 |
| 3 | 500 | 3000 | 4 | 600 | 400 | 1.6984 | 3.35 |
| 4 | 500 | 3000 | 4 | 600 | 0 | 1.6147 | 3.22 |
| 5 | 500 | 3000 | 4 | 600 | 200 | 1.678 | 3.29 |
| 6 | 500 | 3000 | 4 | 600 | 600 | 1.724 | 3.52 |
| 7 | 500 | 3000 | 4 | 600 | 800 | 1.7417 | 3.64 |
| 8 | 500 | 3000 | 4 | 1000 | 400 | 1.7039 | 3.38 |
| 9 | 500 | 3000 | 4 | 200 | 400 | 1.7153 | 3.49 |
| 10 | 500 | 2000 | 2.5 | 600 | 400 | 1.7377 | 3.86 |
| 11 | 500 | 1000 | 2.5 | 600 | 400 | 1.6836 | 3.25 |
| 12 | 500 | 2000 | 3 | 600 | 400 | 1.715 | 3.40 |
| 13 | 500 | 2000 | 4 | 600 | 400 | 1.6785 | 3.25 |
| 14 | 500 | 2000 | 4 | 600 | 0 | 1.5738 | 2.71 |
| 15 | 500 | 2000 | 4 | 600 | 200 | 1.659 | 3.21 |
| 16 | 500 | 2000 | 4 | 600 | 600 | 1.6981 | 3.34 |
| 17 | 500 | 2000 | 4 | 600 | 800 | 1.7149 | 3.43 |
| 18 | 500 | 2000 | 4 | 1000 | 400 | 1.6744 | 3.22 |
| 19 | 500 | 2000 | 4 | 200 | 400 | 1.6902 | 3.28 |
| 20 | 500 | 1500 | 2.5 | 600 | 400 | 1.7121 | 3.54 |
| 21 | 500 | 3000 | 4 | 600 | 0 | 1.6352 | 3.27 |
| 22 | 500 | 3000 | 5 | 600 | 200 | 1.6577 | 3.39 |
| 23 | 500 | 3000 | 4 | 600 | 200 | 1.6879 | 3.44 |
| 24 | 500 | 3000 | 3 | 600 | 200 | 1.7352 | 3.49 |
| 25 | 500 | 3000 | 5 | 600 | 400 | 1.6781 | 3.29 |
| 26 | 500 | 3000 | 4 | 600 | 400 | 1.7055 | 3.40 |
| 27 | 500 | 3000 | 3 | 600 | 400 | 1.7565 | 3.62 |
| 28 | 500 | 2000 | 2.5 | 600 | 400 | 1.7348 | 3.61 |

The exemplary low-k SiC films had a thickness in a range of about from 16 nm to 280 nm, and a dielectric constant, k, in a range of about from 2.7 to 3.9, generally less than 3.5. Measured blanket etch selectivity values were in a range of about from 7.1 to 12.3, generally better than the etch selectivity of silicon carbide films fabricated using tetramethylsilane ("4MS") precursor. Generally, the dielectric constant, k, decreased and the etch selectivity increased as LF power decreased and pressure increased. Generally, k decreased with increased HF power and with increased He flow rate. The stability of k was also tested. In the test, the same film was measured right after deposition and after 96 hours in the clean room environment. The measured k-value in a SiC film typically shifted in a range of about 0.1 to 0.2, which indicated very little change in k after 4 days.

The film stress was measured in representative films within about one hour after the films were formed. The measured stress values were within typical expected ranges of values.

Figure 6:
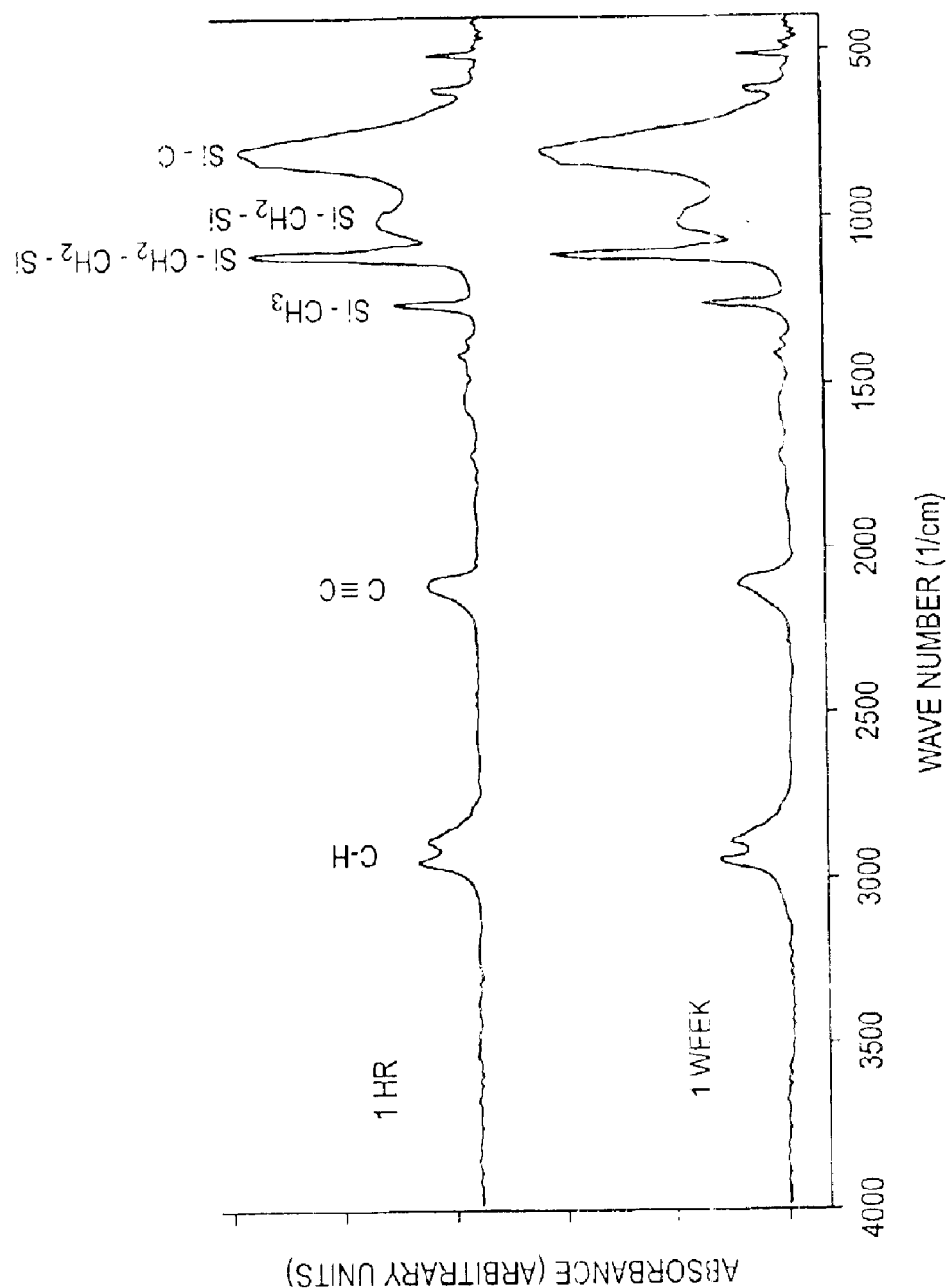
FIG. 6 shows the results of a FTIR analysis of an exemplary low-k SiC layer fabricated in accordance with the invention without doping.

A FTIR analysis of a representative exemplary undoped SiC layer fabricated using. ETMS in accordance with the invention was conducted within an hour after formation, and then one week later following exposure to air. The measured spectra are shown in the graph of FIG. 6. The graph of FIG. 6 shows peaks corresponding to various silicon-carbon bonds. There is no substantial difference between the spectrum measured within one hour and the spectrum measured one week later, indicating that the SiC film is stable as deposited.

The bulk leakage current of exemplary SiC films was measured using a MIS capacitor structure. The measured examples had a film thickness of approximately 75 nm. Capacitors were formed by depositing 1 $\mu$m Cu dots on top of the films. Measurement was carried out at both room temperature and 200° C. Test conditions and results are summarized in Table 2, below. A bias temperature stress test ("BTS") was conducted on an exemplary capacitor, which passed the test at 2 MV/cm and 200° C.

TABLE 2

| TEST CONDITIONS | VALUE |
|---|---|
| 25° C., 1 MV/cm | ~1 $nA/cm^2$ |
| 200° C., 2 MV/cm | <1 $\mu A/cm^2$ |
| BTS (2 MV/cm, 200° C.) | >48 hours |

Table 3 contains data resulting from bulk leakage measurements in the capacitors containing exemplary SiC films, at both room temperature ("RT") and 200° C. Most of the data indicate bulk leakage currents at suitably low levels. Leakage current was inversely proportional to operating pressure during fabrication. The leakage current generally decreased as a result of increased pressure.

TABLE 3

| Wafer ID | ETMS (Sccm) | He (Sccm) | Press (Torr) | HF (W) | LF (W) | Leakage Current 200° C., 2 MV/cm ($\mu A/cm^2$) | Leakage Current RT, 1 MV/cm ($nA/cm^2$) |
|---|---|---|---|---|---|---|---|
| 21 | 500 | 3000 | 4 | 600 | 0 | 0.645 | 4.61 |
| 22 | 500 | 3000 | 5 | 600 | 200 | 0.08 | 0.918 |
| 23 | 500 | 3000 | 4 | 600 | 200 | 0.45 | 3.14 |
| 24 | 500 | 3000 | 3 | 600 | 200 | 7.13 | 7.13 |
| 27 | 500 | 3000 | 3 | 600 | 400 | 5.5 | 5.06 |
| 28 | 500 | 2000 | 2.5 | 600 | 400 | 0.307 | 2.69 |

Figure 7:
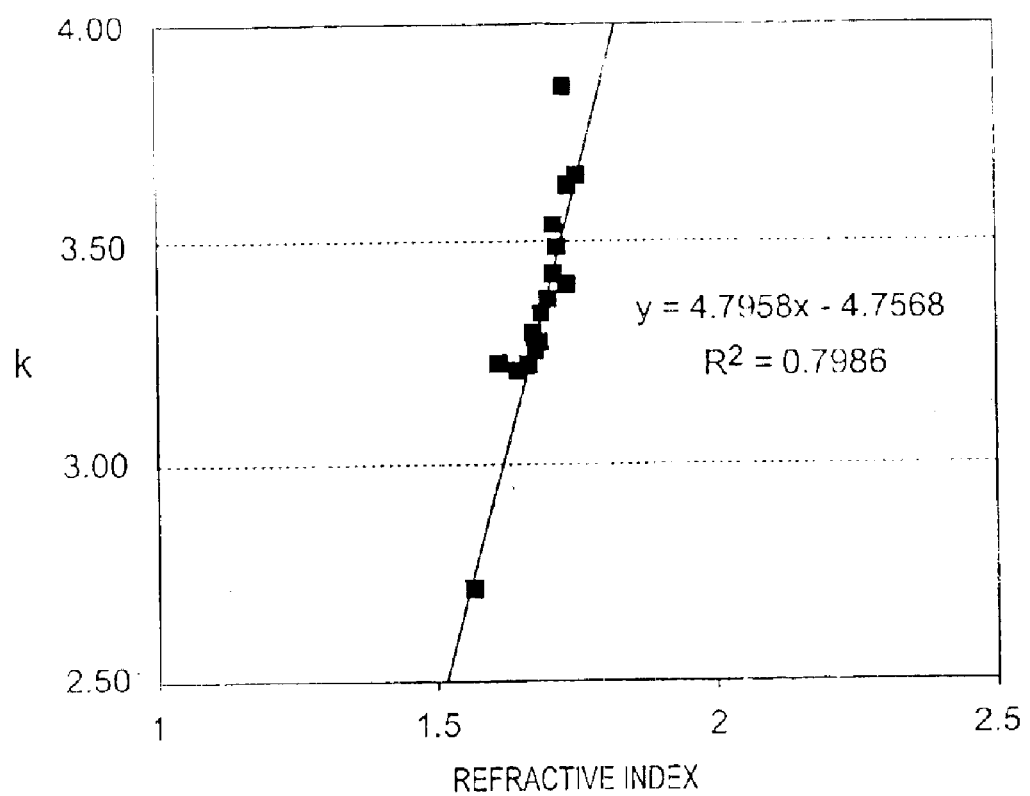
FIG. 7 shows a graph in which the dielectric constant of a series of exemplary SiC layers is plotted as a function of refractive index.

In FIG. 7, dielectric constant, k, of exemplary undoped SiC films fabricated using ETMS was plotted as a function of the films' refractive index ("RI"), measured using conventional techniques. The refractive indices and k-values were measured within about one hour after formation of the films in accordance with the invention. The plotted data indicate a linear correlation between dielectric constant, k, and refrative index. A least-squares analysis was conducted, and the results are shown in FIG. 7, wherein the value. 0.7986 of $R^2$ is the variance. The refractive index is an indicator of the openness of the SiC film structure. The lower the RI-value, the larger is the open volume of the film, and the lower is the dielectric constant, k. Process and operating parameters are tuned in accordance with the invention to achieve a desired refractive index in the film, thereby obtaining a desired dielectric constant.

EXAMPLE 2

A series of doped, low-k SiC films was deposited on silicon substrates using conditions similar to those in Example 1, except carbon dioxide doping gas, $CO_2$, was introduced into the reaction chamber instead of inert helium gas. Operating conditions and measured film characteristics are presented in Table 4, below.

TABLE 4

| Recipe Number | ETMS (Sccm) | $CO_2$ (Sccm) | Pres (Torr) | HF (W) | LF (W) | RI | k (1 hr) | Si—C/ Si—O |
|---|---|---|---|---|---|---|---|---|
| 31 | 500 | 1500 | 2 | 600 | 300 | 1.636 | 3.28 | 1.12 |
| 32 | 500 | 3000 | 2 | 600 | 300 | 1.6553 | 3.53 | 0.86 |
| 33 | 500 | 4500 | 2 | 600 | 300 | 1.6672 | 3.68 | 0.74 |
| 34 | 500 | 1500 | 4 | 600 | 300 | 1.5707 | 2.93 | 1.10 |
| 35 | 500 | 3000 | 4 | 600 | 300 | 1.5782 | 3.10 | 0.88 |
| 36 | 500 | 4500 | 4 | 600 | 300 | 1.5834 | 3.19 | 0.78 |
| 37 | 500 | 1500 | 2 | 600 | 600 | 1.6539 | 3.45 | 0.96 |
| 38 | 500 | 3000 | 2 | 600 | 600 | 1.6721 | 3.76 | 0.74 |
| 39 | 500 | 4500 | 2 | 600 | 600 | 1.6837 | 3.92 | 0.62 |

Figure 8:
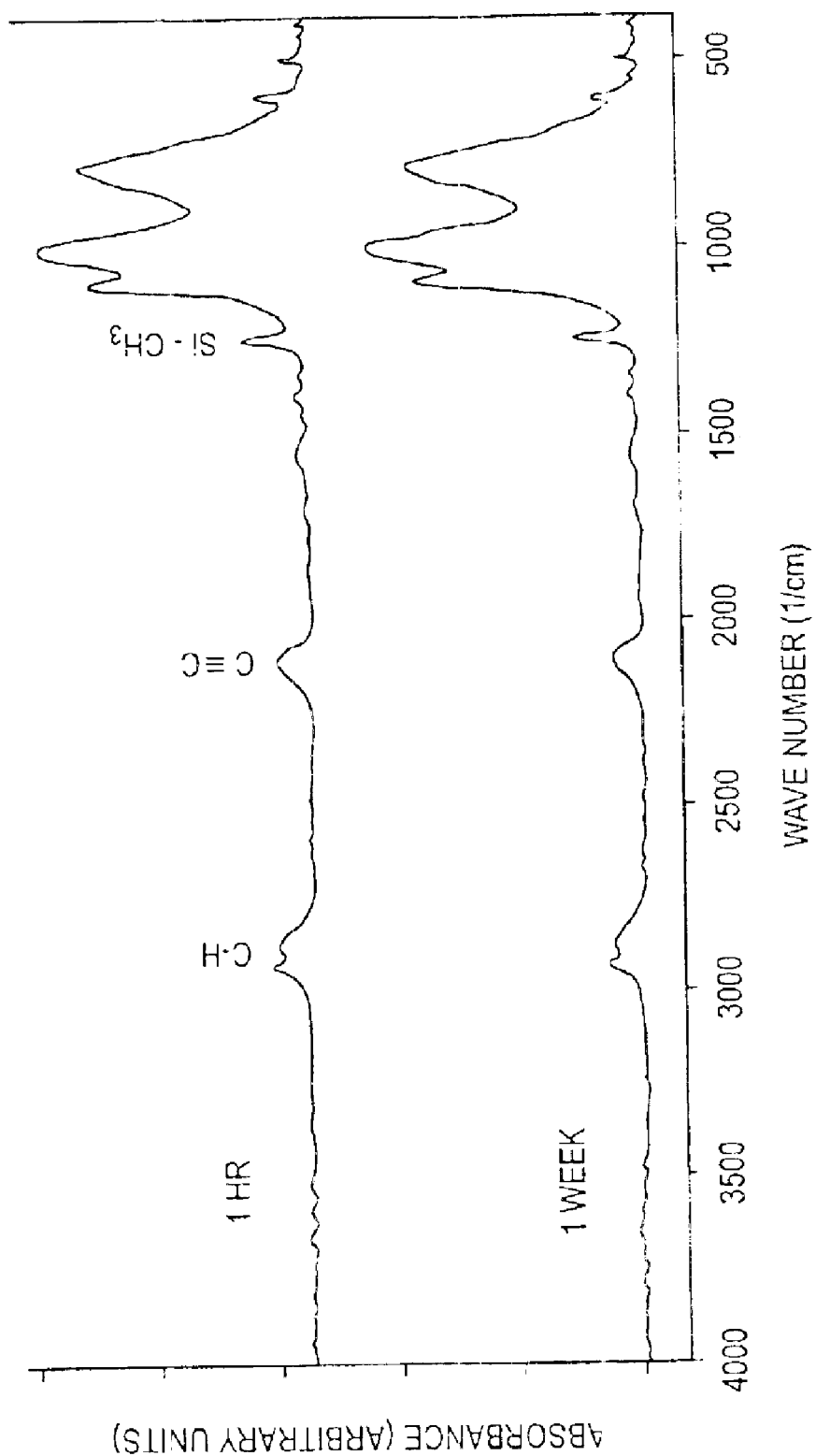
FIG. 8 shows the results of a FTIR analysis of an exemplary low-k SiC layer fabricated in accordance with the invention using $CO_2$ dopant gas.

The films had a thickness in a range of about 75 nm to 79 nm. The stability of the dielectric constant, k, of the films was tested. The measured k-values at one hour after formation of the films was in a range of about 2.9 to 3.9. The dielectric constant was measured right after deposition and after 100 hours in the clean room environment. The measured k-value in a SiC film typically shifted in a range of about 0.1 to 0.2, which indicated very little change in k after 4 days. A FTIR analysis of an exemplary doped SiC layer fabricated using ETMS and $CO_2$ doping gas in accordance with the invention was conducted within an hour after formation, and then one week later following exposure to air. The measured spectra are shown in the graph of FIG. 8. There is no substantial difference between the spectrum measured within one hour and the spectrum measured one week later, indicating that the doped SiC film is stable as deposited. The graph of FIG. 8 shows peaks corresponding to various silicon-carbon bonds. In the spectra, the peak at about 1000 cm⁻1 (Si—O stretching) is significantly higher than the corresponding peak in the spectrum in FIG. 6 of the undoped SiC, indicating the incorporation of oxygen into the exemplary doped low-k SiC film. The ratio of Si—C bonds to Si—O bonds, Si—C/Si—O, was in a range of about 0.6 to 1.1, as measured using FTIR technique. The ratio was obtained by measuring FTIR peak height for Si—C (at ~790 cm⁻1) and Si—O peak height (at~1000 cm⁻1). This is a rough estimate of how much carbon is inside the film. Typically, the higher the Si—C/Si—O ratio, the higher the etch selectivity.

Measured blanket etch selectivity values were in a range of about from 5.8 to 13.3, generally better than the etch selectivity of silicon carbide films fabricated using tetramethylsilane ("4MS") precursor.

Measured stress values were within typical expected ranges of stress values.

EXAMPLE 3

A series of exemplary low-k SiC films was fabricated using a PECVD method in accordance with the invention using the low-k precursor reactant HMDS. Each low-k SiC film was deposited on a 200 mm silicon semiconductor wafer substrate in a Novellus "Sequel" model, 6-station dual-frequency PECVD apparatus. The substrate surface before processing comprised monocrystalline silicon. The low-k SiC was deposited at a wafer temperature of about 400° C. Pure low-k precursor HMDS reactant liquid was injected into the mixing bowl at a flow rate in a range of about 1.0 ccm to 3.0 ccm. The liquid HMDS was gasified in the mixing bowl, where it was mixed with $CO_2$ doping gas. The constant flow rate of $CO_2$ doping gas varied between wafers in a range of about from 2000 sccm to 5000 sccm. The resulting reactant gas mixture was fed into the CVD reaction chamber. HF RF power was applied to the showerhead at a frequency of 13.56 MHz, and the HF power was varied in a range of about from 400 Watts to 700 Watts. LF RF power was applied to the substrate holder at a frequency of 250 kHz, and was varied in a range of about from 0 Watts to 800 Watts. Pressure in the reaction chamber was varied in a range of about from 2 Torr to 4 Torr.

Table 5 below includes operating conditions used in fabricating exemplary doped low-k silicon carbide films in accordance with the invention. It should be understood that Table 5 does not include all process combinations tested. It should be likewise understood that many different combinations of process operating conditions not shown in Table 5 may be utilized in accordance with the invention. Measured film characteristics are also presented in Table 5, below.

TABLE 5

| Run Number | HMDS (ccm) | $CO_2$ (Sccm) | Pres (Torr) | HFRF (W) | LFRF (W) | RI | k |
|---|---|---|---|---|---|---|---|
| 41 | 2 | 3500 | 3 | 700 | 400 | 1.6869 | 3.93 |
| 42 | 2 | 3500 | 2 | 700 | 400 | 1.7323 | 4.12 |
| 43 | 2 | 3500 | 4 | 700 | 400 | 1.6495 | 3.72 |
| 44 | 2 | 3500 | 3 | 400 | 400 | 1.6894 | 3.94 |
| 45 | 2 | 3500 | 3 | 1000 | 400 | 1.6869 | 3.93 |
| 46 | 2 | 3500 | 3 | 700 | 800 | 1.6895 | 3.98 |
| 47 | 1 | 3500 | 3 | 700 | 400 | 1.6527 | 3.91 |
| 48 | 3 | 3500 | 3 | 700 | 400 | 1.6902 | 3.95 |
| 49 | 2 | 2000 | 3 | 700 | 400 | 1.6899 | 3.78 |
| 50 | 2 | 5000 | 3 | 700 | 400 | 1.6819 | 4.01 |

The deposited SiC films had a dielectric constant in a range of about from 3.7 to 4.1, which is significantly less than the dielectric constant of most conventional SiC films. The thickness of the exemplary SiC films was in a range of about from 69 nm to 85 nm. The deposition rate of the films was in a range of about from 166 nm/min. to 413 nm/min. The deposition rate was proportional to pressure and to LF RF power.

A method in accordance with the invention is useful in single-station and multi-station sequential deposition systems for 150 mm, 200 mm, 300 mm, and larger wafer substrates. Although embodiments in accordance with the invention were described herein mainly with reference to a PECVD apparatus and a PECVD method; other embodiments in accordance with the invention may be practiced using a HDP-CVD CVD apparatus and HDP-CVD operating conditions.

Methods, low-k precursors, and low-k SiC in accordance with the invention are useful in a wide variety of circumstances and applications. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods, and compositions described in the claims below and by their equivalents.

We claim:

1. A method of forming oxygen-free silicon carbide having a carbon—carbon triple bond, comprising:

flowing Ethynyltrimethylsilane ("ETMS") into a reaction chamber;

flowing an inert gas into the reaction chamber, wherein said flowing ETMS and an inert gas into the reaction chamber comprises flowing said ETMS and said inert gas at an inert-gas/ETMS-gas flow rate ratio in a range of about from to 2/1 to 6/1;

not flowing into the reaction chamber a substantial amount of an oxidizer, an oxygen-containing doping gas, or any other agent containing an oxygen atom;

forming a plasma in the reaction chamber at a temperature in a range of about from 375° C. to 425° C., at a pressure in a range of about 3 Torr to 5 Torr, by applying HF RF power at a frequency in a range of about from 1 MHz to 30 MHz and at a power level in a range of about from 0.1 W/cm$^2$ to 0.5 W/cm$^2$, and by applying LF RF power to said reaction chamber at a frequency in a range of about from 100 kHz to 500 kHz and at a power level in a range of about from 0.1 W/cm$^2$ to 0.3 W/cm$^2$.

2. A method as in claim 1 wherein said flowing an inert gas comprises flowing a gas selected from the group consisting of neon, helium, and argon.

3. A layer of silicon carbide formed by the method of claim 1.

4. A layer of silicon carbide formed by the method of claim 1 and having a dielectric constant value less than 4.

5. A layer of silicon carbide formed by the method of claim 1 and having a dielectric constant value less than 3.8.

6. A layer of silicon carbide formed by the method of claim 1 and having a dielectric constant value less than 3.5.

7. A layer of silicon carbide formed by the method of claim 1 and having a dielectric constant value less than 3.3.

8. A method of forming oxygen-containing silicon carbide having a carbon—carbon triple bond, comprising:

flowing Ethynyltrimethylsilane ("ETMS") into a reaction chamber;

flowing carbon dioxide ($CO_2$) gas into the reaction chamber, wherein said flowing ETMS and $CO_2$ gas into the reaction chamber comprises flowing said ETMS and said $CO_2$ gas at a $CO_2$-gas/ETMS-gas flow rate ratio in a range of about from to 3/1 to 9/1;

not flowing into the reaction chamber a substantial amount of an oxidizer or any other agent containing an oxygen atom except said $CO_2$ gas;

forming a plasma in the reaction chamber at a temperature in a range of about from 375° C. to 425° C., at a pressure in a range of about 2 Torr to 4 Torr, by applying HF RF power at a frequency in a range of about from 1 MHz to 30 MHz and at a power level of about 0.3 W/cm$^2$, and by applying LF RF power to said reaction chamber at a frequency in a range of about from 100 kHz to 500 kHz and at a power level in a range of about from 0.15 W/cm$^2$ to 0.3 W/cm$^2$.

9. A layer of silicon carbide formed by the method of claim 8.

10. A layer of silicon carbide formed by the method of claim 8 and having a dielectric constant value less than 4.

11. A layer of silicon carbide formed by the method of claim 8 and having a dielectric constant value less than 3.8.

12. A layer of silicon carbide formed by the method of claim 8 and having a dielectric constant value less than 3.5.

13. A layer of silicon carbide formed by the method of claim 8 and having a dielectric constant value less than 3.3.

* * * * *